United States Patent [19]

McMullin

[11] 4,186,409
[45] Jan. 29, 1980

[54] LIGHT ACTIVATED SILICON SWITCH

[75] Inventor: Paul G. McMullin, Plum Borough, Pa.

[73] Assignee: Westinghouse Electric Corp., Pittsburgh, Pa.

[21] Appl. No.: 932,992

[22] Filed: Aug. 11, 1978

[51] Int. Cl.² ............................................. H01L 29/74
[52] U.S. Cl. ........................................ 357/38; 357/30; 357/55; 350/96.11
[58] Field of Search ................... 357/30, 38, 39, 4, 55; 350/96.11, 96.13, 96.17

[56]  References Cited
U.S. PATENT DOCUMENTS

| 3,893,153 | 7/1975 | Page | 357/38 |
|---|---|---|---|
| 4,016,592 | 4/1977 | Yatsuo | 357/38 |
| 4,060,826 | 11/1977 | Voss | 357/38 |
| 4,122,480 | 10/1978 | Silber | 357/38 |
| 4,131,905 | 12/1978 | Hanes | 357/30 |

Primary Examiner—Martin H. Edlow
Attorney, Agent, or Firm—C. L. Menzemer

[57] ABSTRACT

A light activated silicon switch (LASS) is disclosed in which light is transmitted from a light trigger source to appropriate target areas on the body of the silicon wafer. The optical conduits for transmitting the light, such as optical fibers, are underlaid with a metallic coating for establishing electrical contact to the silicon wafer, and are arranged on the surface of the silicon wafer, in a pattern so as to afford the least impediment to thermal conduction. The target areas are spread over the active areas of the silicon wafer so as to approximate uniform turn-on. In the preferred arrangement, the optical channels are arranged radially on the substantially circular silicon wafer, in cooperation with symmetrically placed target spots.

10 Claims, 14 Drawing Figures

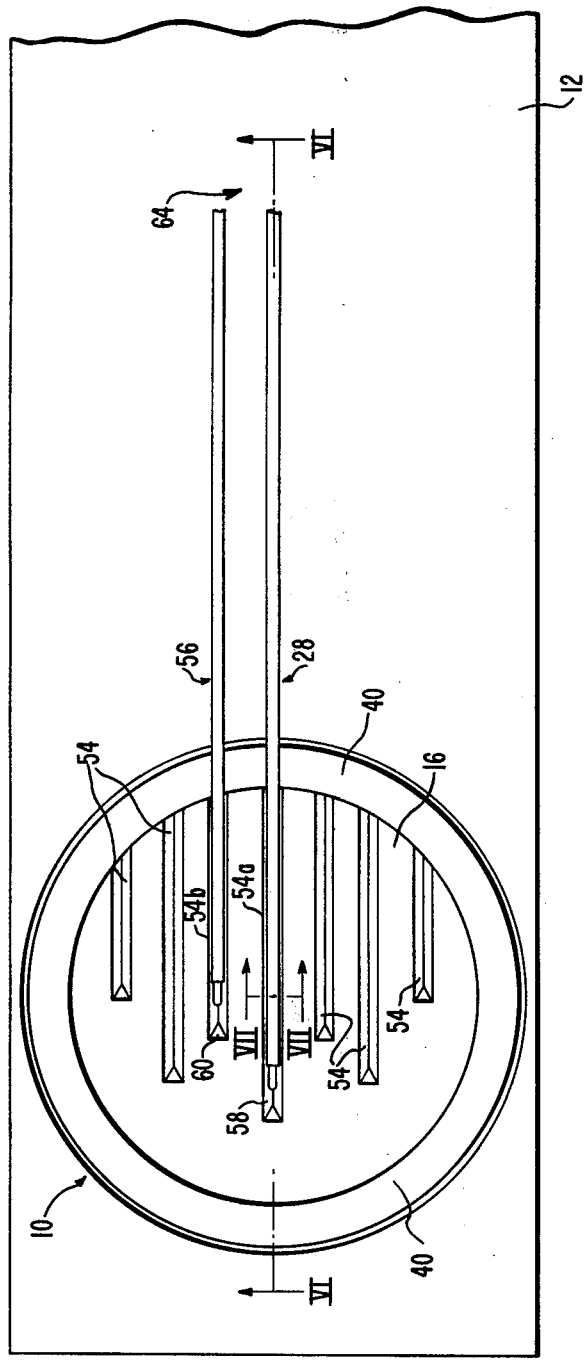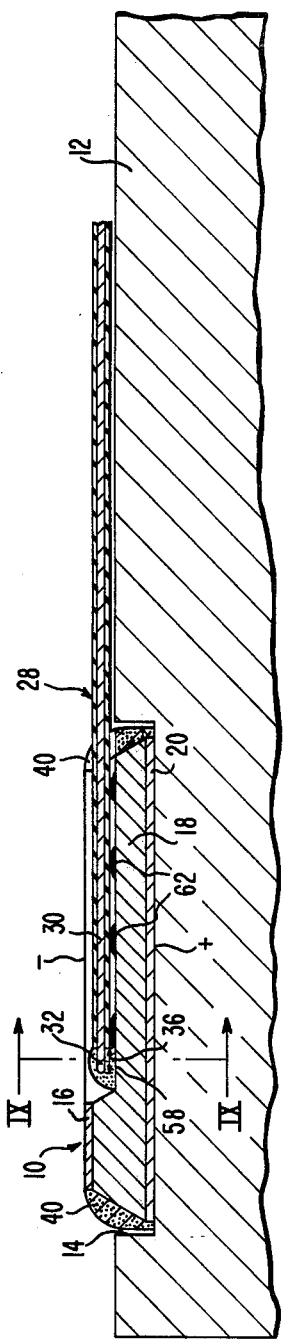

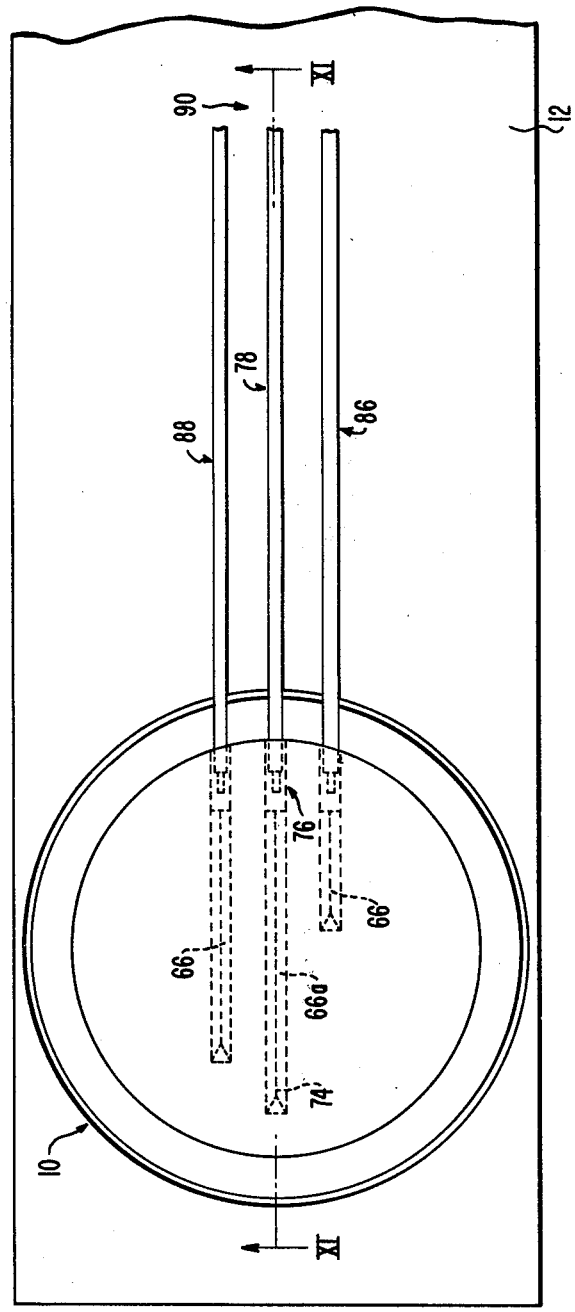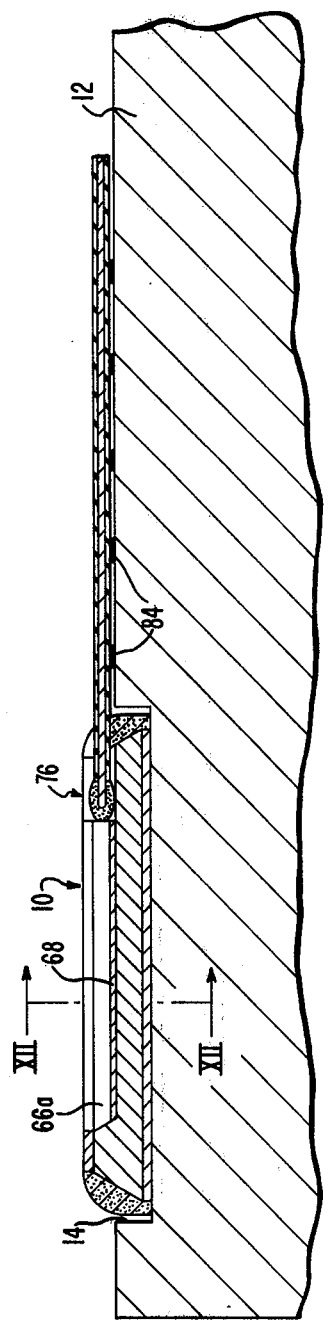

LIGHT ACTIVATED SILICON SWITCH

BACKGROUND OF THE INVENTION

1. Field of the Invention

This invention relates to a light activated silicon switch (LASS).

2. Description of the Prior Art

In order to actuate a LASS, a large amount of light must be delivered to the proper regions inside the device. In order to accomplish this it has been the practice to direct a beam of light on to the surface of the silicon wafer. Typically, the beam is sent in a perpendicular direction to the wafer surface or at Brewster's angle in order to minimize the surface reflection loss.

There are some rather severe disadvantages with these prior art techniques for light coupling to the LASS. Typically, the light is introduced through a central aperture, or one or more rectangular slots arranged in the cathode electrode. Thus the light is introduced into a relatively compact area. It is characteristic of the LASS that current conduction spreads slowly from the region initially turned on as determined by the area exposed to light. Thus it takes a relatively long time for conduction to spread from the light area to cover the entire useful area of the device.

From the illuminated area, the shortest electrical path would be in a direction toward the aperture in the cathode electrode, but obviously, since this presents no electrical contact, the path to the cathode must be longer. This much of the initial current passes through long, relatively high resistance paths in the silicon before it can enter the metal contacts around the aperture. This high resistance causes rapid heating at the beginning of current flow, and limits the amount of current that can be tolerated without device failure.

Further, with the single aperture, or the one or more rectangular slots in the cathode electrode, the heat generated in the silicon wafer in the region where the light impinges, must seek a longer thermal path to those parts of the cathode electrode which are sill intact. There is of course still a thermal path to the anode electrode which also serves as a heat sink. As a result, thermal considerations place an upper limit on the starting current capacity for the device.

SUMMARY OF THE INVENTION

An improved light activated switch is provided having a silicon wafer having an anode and cathode electrode affixed to opposed major surfaces of the wafer. A plurality of target areas are defined on the silicon wafer. A plurality of light transmitting conduits, each having an input connected to a light trigger source, and an output arranged overlying the target area, cooperate to bring a light trigger, on signal to the target areas.

In a preferred embodiment a thick metallic layer is arranged overlying the cathode electrode, the metallic layer having a plurality of radial channels therein to receive the light transmitting conduits.

In another embodiment a plurality of parallel channels of various lengths are cut in the silicon wafer, the termini of these channels, defining a plurality of target areas, a plurality of light transmitting conduits disposed within these channels, cooperate to bring the light trigger on signal to these targets.

The light transmitting conduit in both embodiments may be an optical fiber comprising a central core with an outer cladding, the cladding being removed for a portion of the length of the optical fiber to expose the central core at the target areas.

Additionally, in the parallel channel embodiment, the parallel channels may be used as a wave guide by coating the channel walls with a cladding layer such as silicon dioxide, filling the wave guide core with a light transmitting epoxy resin, and sealing the top portion with an epoxy resin of low index of refraction. As in the case of the optical fiber, the cladding layer i.e. the silicon dioxide, is removed at the termini of the channels to permit light to enter the target areas.

DESCRIPTION OF THE DRAWINGS

FIG. 5 is a top view of the LASS in accordance with a second embodiment of the invention;

FIG. 6 is a cross sectional view of the LASS in accordance with the invention taken along the line 6—6 of FIG. 5;

FIG. 10 is a top view of the LASS in accordance with a third embodiment of the invention;

FIG. 11 is a cross sectional view of the LASS in accordance with the invention taken along the line 11—11 of FIG. 10;

DESCRIPTION OF THE PREFERRED EMBODIMENT

Figure 1:
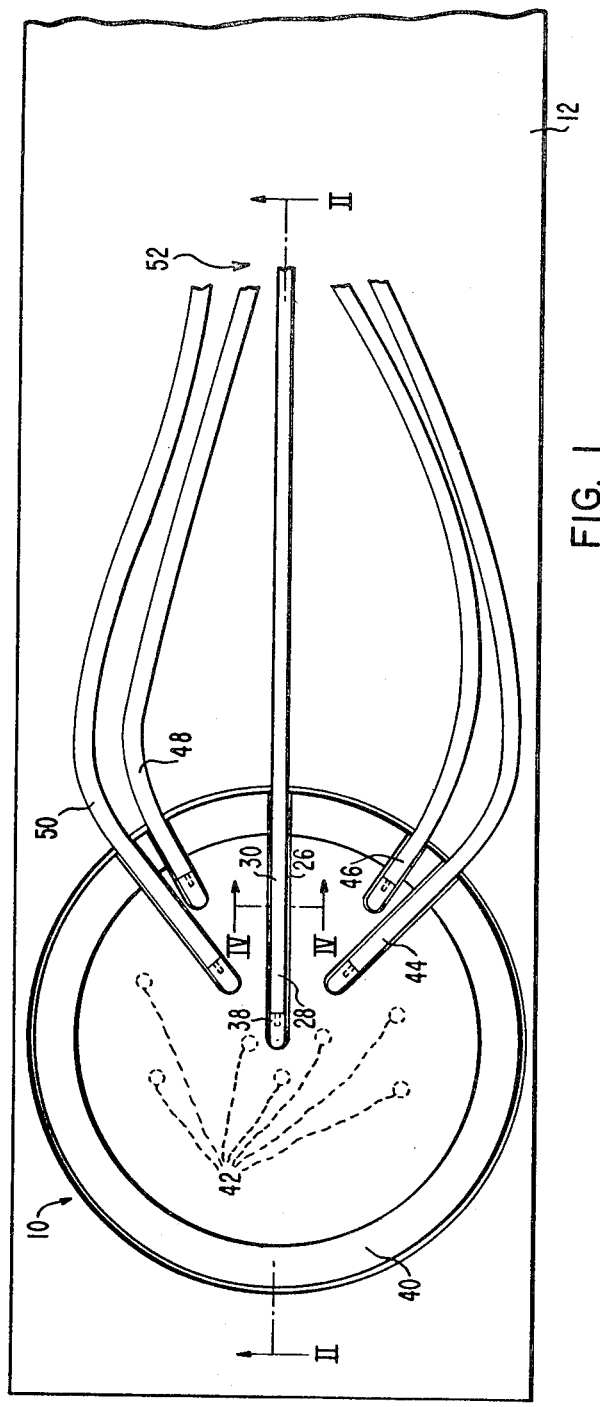
FIG. 1 is a top view of the light activated silicon switch (LASS) in accordance with a first embodiment of the invention.
Figure 2:
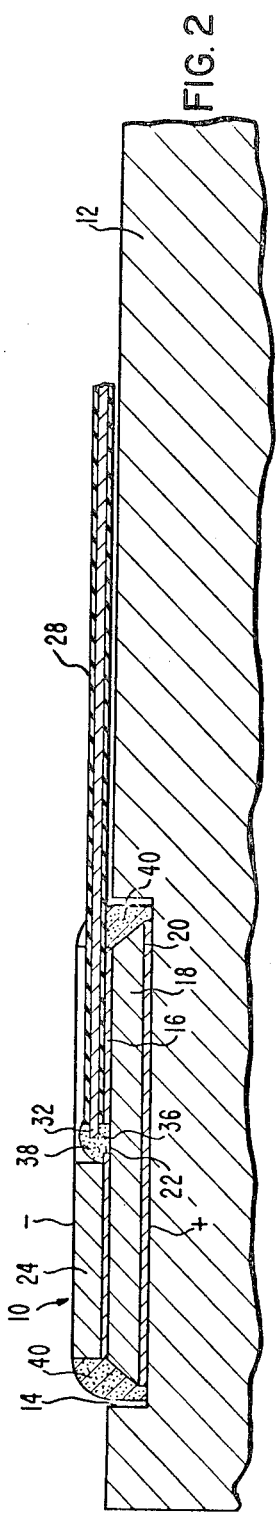
FIG. 2 is a front view of the LASS in accordance with the invention, taken along the line 2—2 of FIG. 1.

Referring now to FIGS. 1 and 2, a light activated silicon switch (LASS) indicated generally at 10, is supported on a metallic carrier 12 recessed at 14.

Figure 3:
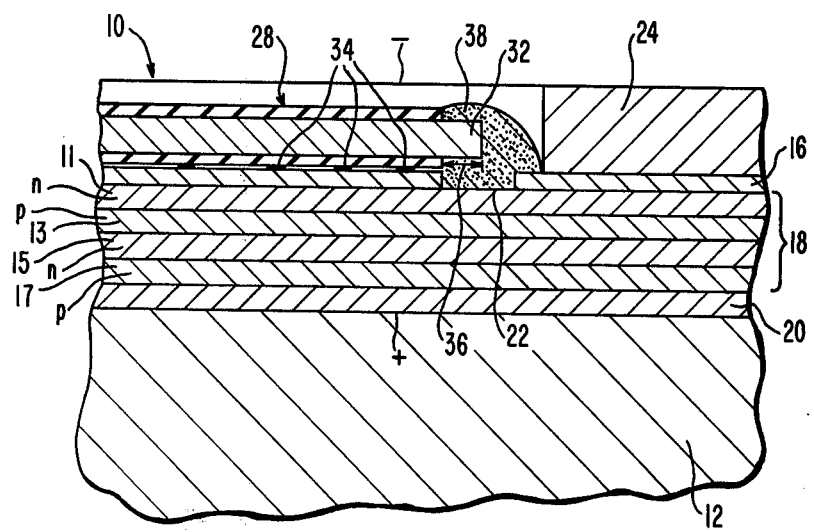
FIG. 3 is an enlarged cross sectional view of the LASS shown in FIGS. 1 and 2.

The LASS, as best shown in the cross sectional view of FIG. 3, comprises a relatively thin metallic layer 16 overlaying, a silicon wafer identified generally at 18, and comprising alternately n and p conducting regions: cathode-emitter 11, cathode-base 13, anode-base 15 and anode emitter 17. The silicon wafer 18 has an internal structure of a thyristor. A metallic body 20 of molybdenum which forms an anode electrode for the LASS is affixed to the anode emitter region 17. The wafer 18 may be manufactured in a number of ways. In the diffusion process, starting with an n-type wafer, an acceptor is diffused to provide a p-n-p structure. Then a donor is diffused into one surface to give the required npnp configuration. The thicknesses of the various regions are controlled to give the required voltage and trigger characteristics. The structure of the silicon wafer 18 is well known in the art: see *"Thyristor Physics"* by Adolph Blicher published by Springer-Verlag, New York 1976 at pages 7-8.

The thin metallic layer 16 contains a plurality of apertures one of which is identified at 22, the purpose of these apertures being to permit light to enter the silicon wafer 18. The thin metallic layer 16 is made of aluminum, which may be about one mil thick. This layer 16 provides electrical contact to the surface of the silicon wafer 18 over the entire surface, except of course at the location of the apertures such as 22. The size of the apertures, i.e. 22 is a compromise between opposing requirements. On the one hand the aperture should be as small as possible in order to avoid unnecessary sacrifice of the electrical contact area to the surface of the silicon wafer. On the other hand the aperture must be large enough to permit a large fraction of the available light to enter the silicon wafer. In the embodiment of FIGS. 1-4, the diameter of the apertures will be of the same order of magnitude, 5 mils, as that of the optical fiber to be subsequently described in connection with FIGS. 3 and 4.

A relatively thick metallic layer 24 overlays the metallic layer 16 and together layers 16 and 24 form the cathode electrode for the LASS. As will be more fully explained when our description returns again to FIGS. 1 and 2, the metallic layer 24 contains a plurality of radial grooves or channels such as FIG. 4:26 for receiving optical conduits for transporting light to such target apertures as FIG. 3:22. The layer 24, which may be of aluminum, has a thickness sufficient to provide the channels (such as FIG. 4:26) with enough depth to support the optical conduit for transporting the light to the target. In the case of the optical fiber to be described, the optical fiber has a diameter of 5 mils, so that a thickness of 8 mils would be more than adequate for layer 24. The thin layer 16 provides a low electrical resistance between cathode-emitter region 11 of the silicon wafer 18 and the thicker metal of the cathode contact 24. In fabricating the device, the thin layer 16 is deposited first, followed by the thick layer 24. Since the two layers are both of aluminum with no separation, in the final assembly, the layers constitute one continuous aluminum layer containing a plurality of channels such as FIG. 4:26.

Figure 4:
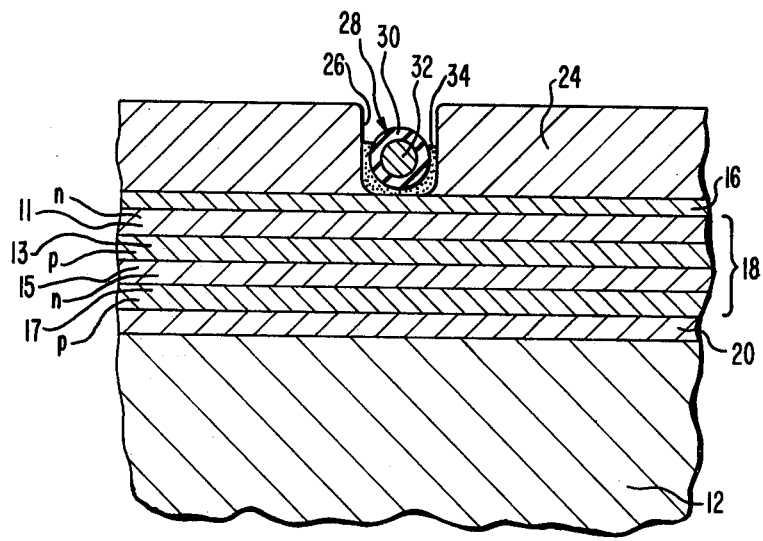
FIG. 4 is a cross sectional view of the LASS taken along the line 4—4 of FIG. 1.

In this and the other embodiments, a light transmitting conduit having two end portions is arranged with one end portion being adapted to be coupled to a light trigger source, with the other end portion overlying a target area. In FIGS. 3 and 4 the light transmitting or optical conduit is illustrated as a light fiber, indicated generally at 28, which comprises cladding or covering 30 and a central fiber core 32. The light fiber 28 is held in place in the radial groove 26 by a suitable adhesive material 34. The primary function of the adhesive material is to mechanically hold the light fiber 28 in place. A conductive adhesive, such as Dynaloy 312, which may be obtained from Dynaloy Inc., of Hanover, N.J., provides excellent adhesion to glass and metal and offers the additional advantage of possessing electrical as well as thermal conductivity.

Dynaloy 312 is a silver filled epoxy resin in the form of a smooth thixotropic paste. It has a volume resistivity maximum 0.01 ohm-cm and a thermal conductivity approximately $25 \times 10^{-4}$ cal/sec/cm$^2$/°C./cm. Other suitable conductive epoxy adhesives which may be used are ECCOBOND 56C made by EMERSON and CUMING, INC., Canton, Mass., and EPOTEK H20 made by EPOXY Technology, Inc., Watertown, Mass. As best shown in FIG. 3, the optical fiber 28 has the cladding 30 removed from the core 32 to provide an exposed portion 36 of central fiber core, so as to deliver light to the target aperture 22. The exposed portion 36 of the fiber core 32 is held in place by means of a light transmissive resin 38, preferably having the same index of refraction as that of the core 32. The optical or light fiber 28 may be selected from the many now commercially available. The core 32 and the cladding 30 may both be of glass, but differing in composition, so that the cladding 30 has a lower index of refraction than that of the core 32, so that it functions to discipline the light to the core region 32 of the optical fiber 28. There are other optical fibers which are commercially available where the cladding 30 is of a plastic material surrounding the core 32 of glass. The same rationale is involved in selecting the optical fiber, that is, the light must be confined to the core 32. In order to effectively transmit the light from the exposed portion of the fiber core 36 into the silicon exposed at the aperture 22, the light transmissive resin 38 must have an index of refraction intermediate between the indices of refraction of the fiber core 32 and the silicon wafer 18, all indices being those for the wave length of the optical drive.

Typically the silicon wafer 18 has an index of refraction of 3.5, while the fiber core 32 has an index of refraction of 1.5. Examples of suitable light transmissive resin 38 include acrylics, silicons, epoxies and polyester resins. A suitable epoxy is STYCAST 1269A which is a transparent epoxy casting resin having the following properties: index of refraction 1.5401, thermal conductivity 0.00065 cal/cm (sec) (cm$^2$) (°C.) with a volume resistivity $7 \times 10^{14}$ ohm-cm.

Returning again to FIGS. 1 and 2, and completing the description of the LASS, passivation for the LASS is identified at 40. The passivation 40 is an organic silicon resin used to prevent leakage currents on the surface of the silicon wafer 18 and also prevents a spurious conductive path from developing between the anode and cathode electrodes. In accordance with this invention, the light energy is delivered to a plurality of small target areas or spots spread over the active area of the wafer 18. In FIG. 1, these areas are identified by the plurality of dotted circles indicated generally at 42. These target areas are provided by suitable apertures arranged in the thin layer 16 in the manner of aperture 22 so as to afford access to the silicon wafer 18.

The light energy for the target areas 22, 42, is delivered by means of optical fibers such as 28 described above in connection with FIGS. 3 and 4. In FIG. 1 additional optical fibers are identified generally at 44, 46, 48 and 50, but it will of course be understood that there is an optical conduit or optical fiber for each of the target apertures 42; these additional optical fibers have not been included in order to simplify the drawing. The optical fibers 28, 44, 46, 48 and 50 are arranged in a radial pattern on the metallic surface 24, and extend over the rim of the device, where they are gathered in a bundle, indicated generally at 52 of circular cross section for coupling to an optical driver. In this embodiment the circular cross section of bundle 52 matches the beam geometry of the driving source which may be a neodymium: Yttrium aluminum garnet (Nd: YAG) laser or any other light source which produces light having a wave length of 1.064μ meters.

Figure 7:
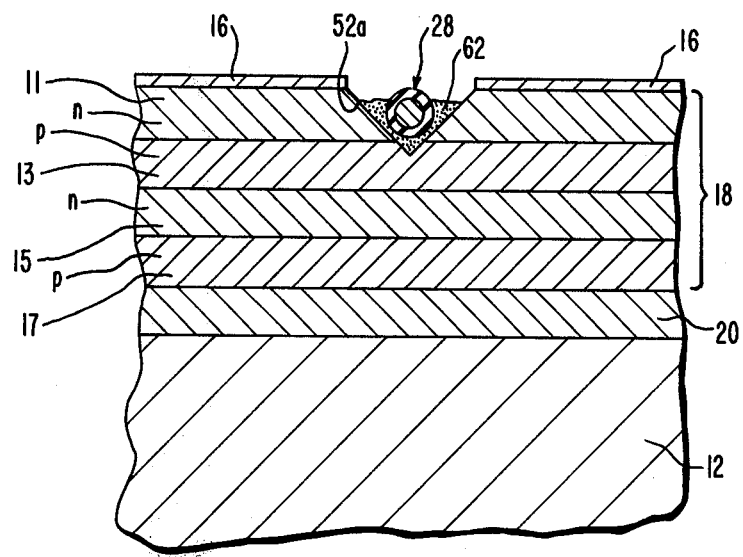
FIG. 7 is a cross sectional view taken along the line 7—7 of FIG. 5.
Figure 8:
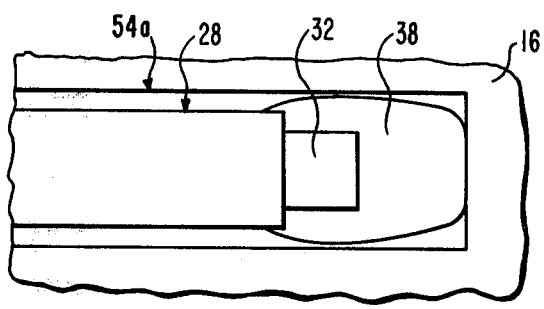
FIG. 8 is a top view of the optical conduit used in the second embodiment, with the cladding removed in the vicinity of the target area.

Another embodiment of the invention is depicted in FIGS. 5, 6, 7 and 8. In order to avoid needless repetition, parts which are similar to those in the previous embodiment bear the same numerical identification. In the instant embodiment a plurality of parallel V-shaped grooves or channels FIG. 5:56 are etched in the surface of the silicon wafer 18 through the n-layer and into the p-layer as shown in FIG. 7 (cathode-base region). By the use of well known etchants and techniques such as described in the paper entitled *"High Density Multichannel Optical Waveguides With Integrated Couplers"* Harper & Heidrich appearing in Wave Electronics 2 (1976) at pages 369–377, it is possible to produce very well controlled dimensions and shapes of the etched grooves or channels. One etchant which has been successfully used comprises ethylenediamine 35.1 mole percent, pyrocatechal 3.7 mole percent, and water 61.2 mole percent. The action of such etchants is to rapidly remove silicon material until a particular crystal plane surface is exposed. Specifically, the etchant is used until a (111) crystallographic plane is exposed. Such (111) planes are so disposed in the silicon crystal that etching a (100) oriented silicon surface produces grooves of V-shaped cross section as described fully in the paper by Harper and Heidrich cited supra. The groove of channel 54 is made deep enough to accommodate the optical fiber 28, so that the fiber is not subjected to mechanical stress when the wafer is mounted in the conventional press type holder (Thus a thicker metallized layer such as 24 in FIG. 1 is not required in this embodiment).

Each of the parallel grooves or channels 54 is provided with an optical fiber. In order to simplify the drawing, for illustrative purposes only grooves 54a and 54b of the parallel array have been fitted with optical fibers 56 and 28 respectively. As in the previous embodiments, the light energy is delivered to a plurality of target areas such as 58 and 60. For example, the light energy is coupled from the core 32 of the fiber 28 into the silicon wafer 18 at the target area 58, by removing the cladding 30 from the end of the fiber 28 and surrounding the exposed core with a suitable light transmissive resin 38 which also fills the etched groove. As in the previous embodiment a suitable light transmissive resin 38 would be that identified as STYCAST No. 1269A which may be obtained from Emerson and Cuming Co. of Canton, Mass. The target areas 58, 60 are spaced over the active area of the silicon wafer to approximate uniform turn on. The optical fibers are held in place in the grooves or channels by a suitable adhesive identified at 62 (FIGS. 6 and 7). As in the previous embodiment, the optical fibers (such as illustrative fibers 56 and 28) are gathered in a bundle of circular cross section for coupling at FIG. 5:64 to an optical driver.

Figure 12:
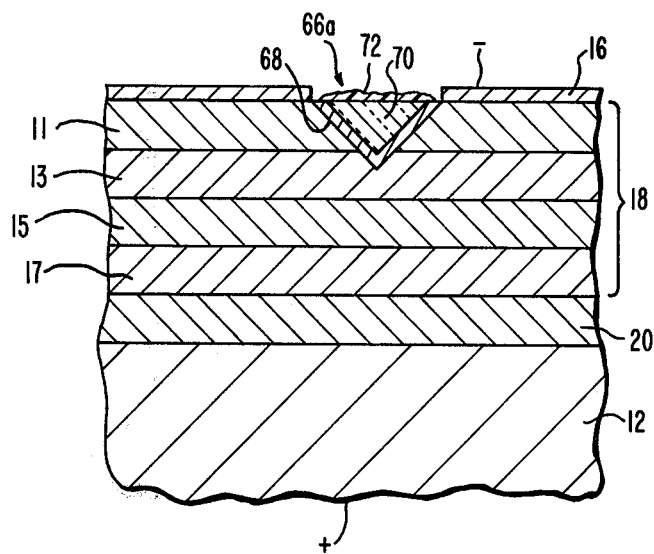
FIG. 12 is a cross sectional view of the LASS device taken along the line 12—12 of FIG. 11.

In the embodiment of FIGS. 10, 11, 12, 13 and 14 the optical fiber is replaced by an optical wave guide fabricated in place in the silicon wafer. As in the previous embodiment a plurality of parallel channels or grooves 66 are etched in the surface of the silicon wafer 18. The central channel 66a of the array is shown in FIG. 11. As best shown in FIG. 12, each optical wave guide is fabricated by coating the V-shaped channel walls with a layer of silicon dioxide 68 which forms the cladding. The $SiO_2$ layer acts to confine the light to the wave guide core 70, in the same way that the cladding 30 of the optical fiber 28 confines the light to the core 32. In order to provide adequate confinement the $SiO_2$ layer must be at least 1 μm thick. The wave guide core 70 is a light transmissive resin which must have an index of refraction greater than that of the $SiO_2$ cladding. The $SiO_2$ cladding, thermally grown has an index of refraction 1.42–1.46. A material which has been demonstrated to be suitable for the wave guide core 70 is the epoxy STYCAST No. 1269A which has an index of refraction of 1.5401 and may be obtained from Emerson & Cuming of Canton, Mass.

Examples of other suitable materials for the wave guide core 70 are: acrylic, silicone, polyester, polystyrene, polycarbonate, and polymethylpentene resins and the alumino silicate glass identified as No. 1723 glass having an index of refraction of 1.5+, manufactured by Corning Glass Works, Corning, N.Y. Loss of light through the top of the wave guide (FIG. 12) is prevented by covering the surface with a thin layer 72 (thicker than 2μ meters) of a material with a lower index of refraction than that of the epoxy core 70. A suitable material for covering 72 would be an optical plastic such as ethylacrylate which has an index of refraction of 1.47 and may be obtained from Eastman Organic Chemicals a division of the Eastman Kodak Corporation of Rochester, N.Y. 14650.

Figure 13:
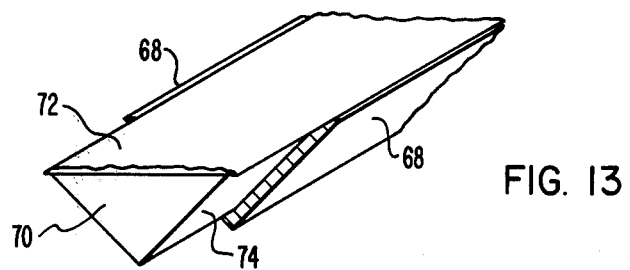
FIG. 13 is an isometric view of the V channel of the FIG. 10 and FIG. 11 embodiment, with the silicon dioxide cladding removed in the region of the target area.

Referring now to FIG. 13, which is a perspective view of the optical wave guide, the cladding or silicon dioxide coating 68 is removed from the sides of the V channel as shown at 74 in FIG. 13 to permit the light to enter the silicon wafer. While this has been shown for only one channel, i.e. 66a, it wil be appreciated that this is done for all the channels (66) so that light enters the silicon wafer at a plurality of target areas such as 74.

Figure 14:
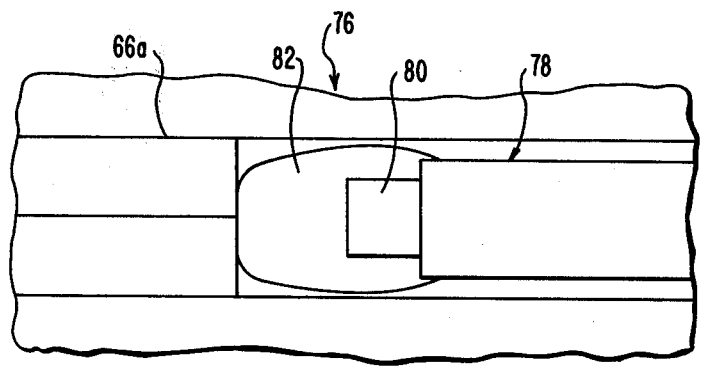
FIG. 14 is a top view of the coupling for the two optical conduits used in the FIGS. 10 and 11 embodiment.

The optical wave guides are connected to optical fibers such as 78, 86, 88 through a coupling such as the coupling identified generally at 76 for wave guide 66a, and shown in greater detail in FIG. 14. The optical fiber identified at 78 has the cladding removed to expose the core 80. The optical fiber 78 is positioned in spaced relationship with the optical wave guide 66a, and a union is formed by means of clear or transparent epoxy 82. The most efficient transfer of light energy from the optical fiber 78 to the wave guide (FIG. 13) would be effected by using an epoxy with an index of refraction intermediate between that of the fiber core and that of the wave guide core 70 or else equal to the index of refraction of the fiber core or the wave guide core 70. For example, to couple an optical fiber to a wave guide core 70 which is composed of No. 1269A epoxy from Emerson & Cuming, Canton, Mass. the epoxy 82 (FIG. 14) could also be the same same epoxy, i.e. No. 1269A.

Referring now to FIGS. 10 and 11 the optical fiber 78 is held in place on the carrier 12 by means of adhesive material 84, such as Dynaloy 312 previously mentioned and identified. The plurality of optical fibers two of which are shown at 86, 88 are gathered together in a bundle at 90 for coupling to an optical driver.

In these embodiments, the objective is to deliver the light trigger signal to small target areas or spots which are as uniformly distributed over the entire area of the device as is possible. The channels 66 carrying the light should be arranged to occupy a minimum amount of surface area since these optical channels 66 interfere with electrical flow or with thermal transfer or both, thereby reducing the maximum power that can be safely controlled by the device. This objective is achieved in the embodiment of FIGS. 1, 2, 3 and 4, by the radial geometry wherein the channels go straight from the target areas (FIG. 1:42) to the rim of the wafer 18 along a radial line. However, in the other two embodiments (FIGS. 5, 6, 7, 8, 9 and FIGS. 10, 11, 12, 13, 14) the etched channels in the silicon wafer must be formed along crystallographic alignments thus preventing the preferred radial geometry of the first embodiment. In these latter two embodiments then in order to occupy as little of the surface area as possible, some compromise must be made, resulting in a somewhat non-uniform distribution of target spots. The target spots are spread over the active area of the silicon wafer to approximate uniform turn on.

Figure 9:
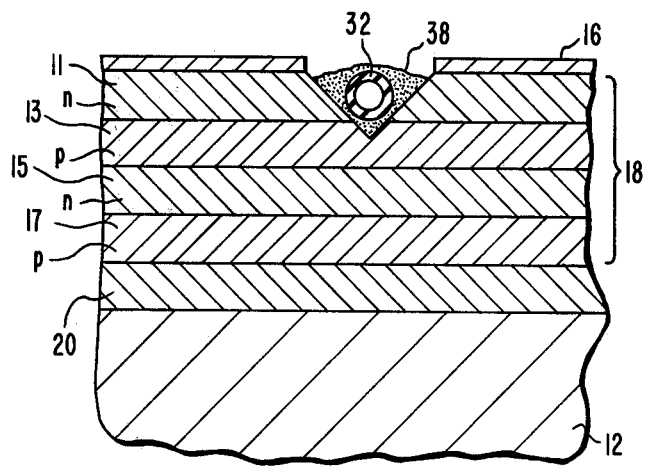
FIG. 9 is a cross sectional view of the LASS device in accordance with the invention, taken along the line 9—9 of FIG. 6.

Although the second and third embodiments (FIGS. 5, 6, 7, 8, 9 and FIGS. 10, 11, 12, 13, 14) respectively are somewhat more difficult to fabricate than the first preferred embodiment (FIGS. 1, 2, 3 and 4), nevertheless, they do possess certain advantages. Because the index of refraction of silicon is so high, the light will enter the target substantially normal to the side walls of the V channels etched in the silicon wafer. Thus as shown in FIG. 9 for example, when conduction is initiated, the resulting current has a short low resistance path in the current path between the anode 20 and the cathode 16. As a result of this low resistance path, there is a minimum of heating of the silicon wafer, and higher turn on currents can be safely tolerated. This is true of both the second and third embodiments. The major advantage of the third embodiment resides with the possibilities for batch processing in the making of the wave guides and the terminations.

I claim:

1. A light activated silicon switch comprising:
   (a) a silicon wafer having cathode-emitter, cathode-base, anode-base and anode-emitter regions;
   (b) anode and cathode electrodes affixed to said anode and cathode emitter regions respectively;
   (c) a plurality of target areas on said cathode emitter region; and
   (d) a plurality of light transmitting conduits, each conduit having two end portions, one end portion being adapted to be coupled to a light trigger source, and the other end portion overlying one of said plurality of target areas.

2. A light activated silicon switch according to claim 1, wherein said target areas are defined by openings in said cathode electrode uniformly distributed over said cathode emitter region of said silicon wafer.

3. A light activated silicon switch according to claim 1, wherein said cathode electrode comprises in part a plurality of channels arranged therein for receiving said plurality of light transmitting conduits, said cathode electrode being apertured entirely therethrough, in proximity to one of said conduit end portions.

4. A light activated silicon switch according to claim 3, wherein said silicon wafer is substantially circular, and said channels are arranged in a radial direction in said cathode electrode.

5. A light activated silicon switch according to claim 4, wherein:
   said light transmitting conduit is an optical fiber comprising,
   a central core with an outer cladding, said cladding being removed for a portion of the length of said optical fiber to expose said central core; and
   a light transmitting material covering said exposed central core and filling said cathode electrode apertures.

6. A light activated silicon switch comprising:
   (a) a silicon wafer having cathode-emitter, cathode-base, anode-base and anode-emitter regions;
   (b) an anode electrode affixed to said anode emitter region;
   (c) a plurality of parallel channels cut in said cathode-emitter region and extending in depth into the cathode-base region, said parallel channels in the longitudinal direction extending from the periphery of said silicon wafer for different lengths, the ends of which provide a plurality of terminals, said termini defining a plurality of target areas;
   (d) a plurality of light transmitting conduits disposed within said parallel channels, each light transmitting conduit having an input and an output, said input being adapted to be coupled to a light trigger signal source, said output being at said terminal of said channel; and
   (e) a cathode electrode affixed to the uncut portions of said cathode emitter region.

7. A light activated silicon switch according to claim 6, wherein:
   said light transmitting conduit is an optical fiber comprising a central core with an outer cladding, said cladding being removed for a portion of the length of said optical fiber to expose said central core at said terminal; and
   a light transmitting material covering said exposed central core and filling the unoccupied portion of the channel terminal.

8. A light activated silicon switch comprising:
   (a) a silicon wafer having cathode-emitter, cathode-base, anode-base and anode-emitter regions;
   (b) an anode electrode affixed to said anode-emitter region;
   (c) a plurality of optical wave guides, comprising a plurality of parallel channels cut in said cathode-emitter region and extending in depth into the cathode-base region, said parallel channels in the longitudinal direction extending from the periphery of said silicon wafer for different lengths the ends of which provide a plurality of end terminals, each channel having the sides thereof covered with a cladding layer, a central core of light transmitting material and a covering of low index of refraction material to discipline the light to follow the path of said central core, one end of each channel being adapted to be coupled to a light trigger source, the terminal end of each channel having the cladding layer removed for a portion of its length, the removed cladding layers at the channel termini defining a plurality of target areas; and
   (d) a cathode electrode affixed to the uncut portions of said cathode-emitter region.

9. A light activated silicon switch according to claim 8, wherein:
   said channels are V-shaped, and light at the target areas is directed substantially normal from the sides of the respective channels into said silicon wafer.

10. A light activated switch according to claim 8, wherein:
    said cladding layer is silicon dioxide, and said central core is a light transmissive resin.

* * * * *